United States Patent
Pfeffer et al.

(10) Patent No.: US 11,676,991 B2
(45) Date of Patent: Jun. 13, 2023

(54) SEMICONDUCTOR LIGHT EMITTING DEVICE

(71) Applicant: Lumileds LLC, San Jose, CA (US)

(72) Inventors: Nicola Bettina Pfeffer, Eindhoven (NL); Arjen Gerben Van der Sijde, Eindhoven (NL); Pieter Johannes Quintus van Voorst Vader, Son (NL)

(73) Assignee: Lumileds LLC, San Jose, CA (US)

(*) Notice: Subject to any disclaimer, the term of this patent is extended or adjusted under 35 U.S.C. 154(b) by 97 days.

(21) Appl. No.: 16/930,159

(22) Filed: Jul. 15, 2020

(65) Prior Publication Data

US 2021/0028226 A1 Jan. 28, 2021

(30) Foreign Application Priority Data

Jul. 23, 2019 (EP) ..................................... 19187728

(51) Int. Cl.
| | |
|---|---|
| *H01L 27/15* | (2006.01) |
| *H01L 33/62* | (2010.01) |
| *H01L 33/00* | (2010.01) |
| *H01S 5/183* | (2006.01) |
| *H04M 1/02* | (2006.01) |

(52) U.S. Cl.
CPC ........ *H01L 27/156* (2013.01); *H01L 33/0093* (2020.05); *H01L 33/62* (2013.01); *H01S 5/183* (2013.01); *H04M 1/0264* (2013.01)

(58) Field of Classification Search
None
See application file for complete search history.

(56) References Cited

U.S. PATENT DOCUMENTS

| | | | |
|---|---|---|---|
| 8,058,669 B2* | 11/2011 | Chen | H05K 1/113 |
| | | | 257/E33.057 |
| 2003/0183751 A1* | 10/2003 | Hakamata | H01L 25/0753 |
| | | | 257/E25.02 |
| 2010/0051972 A1 | 3/2010 | Chen et al. | |

(Continued)

FOREIGN PATENT DOCUMENTS

| | | |
|---|---|---|
| EP | 1349213 A2 | 10/2003 |
| EP | 1908124 A2 | 4/2008 |

(Continued)

OTHER PUBLICATIONS

"European Patent Application Serial No. 19187728.1, European Search Report dated Nov. 19, 2019", 8 pgs.

(Continued)

*Primary Examiner* — Robert K Carpenter

(74) *Attorney, Agent, or Firm* — Schwegman, Lundberg & Woessner, P.A.

(57) ABSTRACT

A semiconductor light-emitting device has an emitter matrix with an arrangement of emitter cells interspersed with non-emitter cells. The emitter cell has a semiconductor emitter, and a non-emitter cell does not have a semiconductor emitter. A number of bond pads for connection to a power supply and a plurality of wirebonds are present. Each wirebond extends from a bond pad to the semiconductor emitter of an emitter cell. An imaging arrangement includes a light source for illuminating a scene. The light source has a pair of such semiconductor light-emitting devices. A method of manufacturing such a semiconductor light-emitting device is also described.

19 Claims, 5 Drawing Sheets

(56) References Cited

U.S. PATENT DOCUMENTS

| | | |
|---|---|---|
| 2010/0090229 A1 | 4/2010 | Harada |
| 2012/0154945 A1* | 6/2012 | Hiatt ................. H01L 27/14685 |
| | | 359/894 |
| 2012/0319122 A1* | 12/2012 | Ma ..................... H01L 51/5284 |
| | | 438/34 |
| 2017/0179192 A1 | 6/2017 | Zhang et al. |
| 2019/0198732 A1 | 6/2019 | Shimizu et al. |

FOREIGN PATENT DOCUMENTS

| | | | |
|---|---|---|---|
| EP | 1349213 A3 | 8/2010 | |
| WO | WO-2017028439 A1 * | 2/2017 | ............. G02B 30/24 |

OTHER PUBLICATIONS

"International Application Serial No. PCT/EP2020/067807, International Search Report dated Sep. 1, 2020", 3 pgs.

"International Application Serial No. PCT/EP2020/067807, Written Opinion dated Sep. 1, 2020", 7 pgs.

"Taiwanese Application Serial No. 109123554, Office Action dated Jul. 20, 2020", (w/ English Translation), 4 pgs.

"Taiwanese Application Serial No. 109123554, Response filed Aug. 31, 2020 to Office Action dated Jul. 20, 2020", (w/ English Translation), 6 pgs.

\* cited by examiner

SEMICONDUCTOR LIGHT EMITTING DEVICE

PRIORITY APPLICATION

This application claims the benefit of priority to European Patent Application Serial Number 19187728.1, filed Jul. 23, 2019, which is incorporated herein by reference in its entirety.

TECHNICAL FIELD

The present disclosure describes a semiconductor light-emitting device; a method of manufacturing such a semiconductor light-emitting device; and an imaging arrangement comprising a pair of such semiconductor light-emitting devices BACKGROUND To capture an image using an image sensor of a compact imaging arrangement, in a mobile device for example, it is usual to illuminate the scene using a semiconductor light source, for example an array of light-emitting diodes (LEDs) or vertical cavity surface emitting lasers (VCSELs). An adaptive semiconductor light source (also referred to as an adaptive irradiance unit), i.e., an array of individually addressable segments (each of which can comprise one or more light-emitting elements), can be used to ensure optimum exposure over the scene and can therefore result in better images. By only illuminating each scene region by the desired amount, an adaptive semiconductor light source can therefore reduce power consumption, which can be a significant advantage when the imaging system is incorporated in a device such as a smartphone and should not deplete the battery.

Usually, it is desirable to have a very compact light source, i.e., the segments of an array are next to each other in a die. While this is practicable for an array of visible-spectrum LEDs, it can be a problem in the case of infrared (IR) LEDs. This is because an infrared LED is preferably connected by wirebond to a bonding pad of the die. In an array with many infrared LEDs, the wirebonds are also problematic because they are arranged in the light path, and also because wirebonds use sufficient "headroom", i.e., sufficient space to ensure that the wirebonds are not damaged. Another problem with large IR-LED arrays is that the wirebonds to the center of the array are significantly longer than the wirebonds to the outer regions of the array, and can limit the highest achievable switching frequency. As an alternative to using wirebonds, an IR-LED array may be manufactured as a flip-chip device, but this comes at a cost of about half the output power, since flip-chip IRLEDs are less efficient.

BRIEF DESCRIPTION OF THE DRAWINGS

Examples will now be described in detail with reference to the accompanying drawings, in which.

In the drawings, like numbers refer to like objects throughout. Objects in the diagrams are not necessarily drawn to scale.

DETAILED DESCRIPTION OF THE EMBODIMENTS

Figure 1:
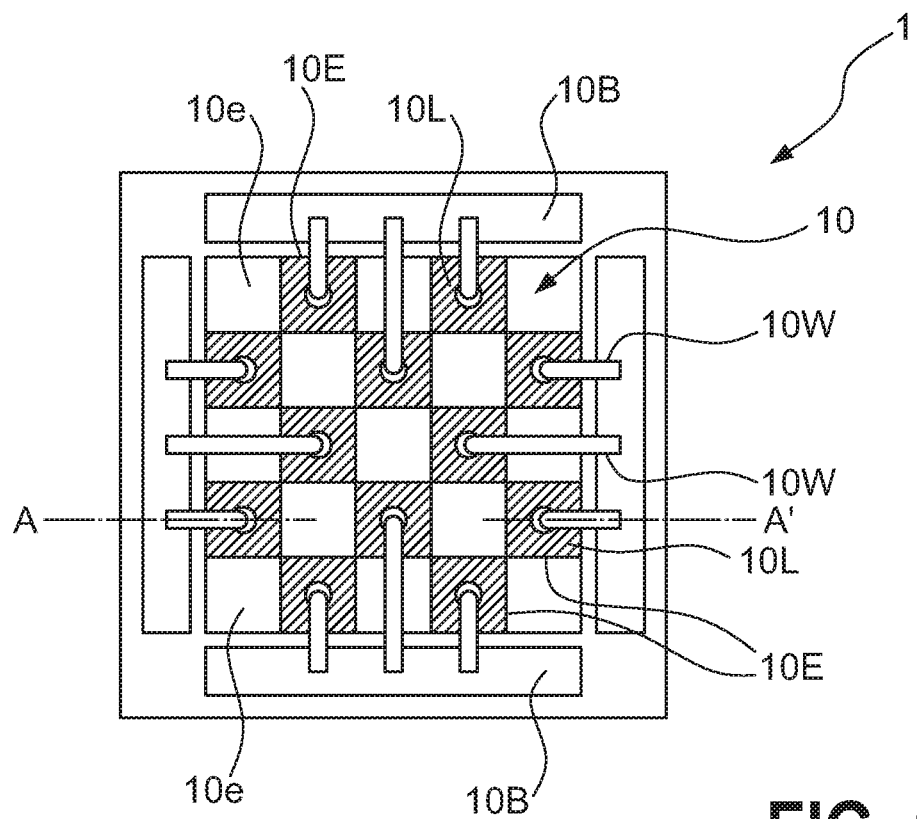
FIG. 1 shows an embodiment of a semiconductor light-emitting device.

A semiconductor light-emitting device, a method of manufacturing a semiconductor light-emitting device; and an imaging arrangement of claim are described herein.

In some embodiments, a semiconductor light-emitting device includes an emitter matrix having an arrangement of emitter cells interspersed with non-emitter cells. An emitter cell includes a semiconductor emitter, and a non-emitter cell does not include a semiconductor emitter. Bond pads are used for connection to a power supply. A plurality of wirebonds are used in which each wirebond extends from a bond pad to the semiconductor emitter of an emitter cell.

The semiconductor light-emitting device is used to illuminate a scene. The semiconductor emitter is manufactured to achieve a luminous intensity of 5-100 Mcd/m$^2$ (megacandela per square meter).

The ratio of emitter cells to non-emitter cells in the emitter matrix is preferably 1:1 or as close to this ratio as possible, although other ratios (e.g., 0.75) are possible.

Because the emitter matrix (or "emitter array") is formed as an arrangement of emitter cells interspersed with empty cells or non-emitter cells, the arrangement of wirebonds is favourably sparse. This means that the wirebonds extending into the center of the emitter matrix can be significantly shorter than equivalent wirebonds of an emitter matrix comprising only emitter cells. The semiconductor light-emitting device therefore uses less "headroom" or clearance. Because the emitter cells are interspersed with non-emitter cells, the number of emitters traversed by a wirebond is less than in an emitter array that is filled with emitters. This means that a considerably lower fraction of the total emitted light is blocked by the wirebonds, so that the ratio of emitted light to net light output compares favourably with other emitter arrays. The number of wirebond shadows that are projected onto the scene is also reduced. In addition, the larger "spread" of emitters (the emitter cells being interspersed with empty cells) leads to an improvement in thermal performance. This is because the heat generated by any active emitter cell can dissipate more rapidly, since heat can also dissipate through the neighbouring "empty" or non-emitter cells.

A method of manufacturing such a semiconductor light-emitting device includes manufacturing an emitter matrix to include an arrangement of emitter cells interspersed with non-emitter cells, whereby a semiconductor emitter is formed in each emitter cell, and no semiconductor emitter is formed in a non-emitter cell. The method further includes forming a number of bond pads at one or more edges of the semiconductor light-emitting device, and connecting a wirebond between each semiconductor emitter and a bond pad.

The method can result in a relatively economical semiconductor light-emitting device, since it is easier to connect wirebonds to the semiconductor emitters on account of the non-emitter cells interspersed throughout the emitter matrix.

In some embodiments, the imaging arrangement includes a light source for illuminating a scene, which light source includes a pair of such semiconductor light-emitting devices, wherein the emitter array of a first semiconductor light-emitting device is arranged to illuminate essentially one half of the scene and the emitter array of the second semiconductor light-emitting device is arranged to illuminate essentially the other half of the scene. The imaging arrangement further includes an image sensor arrangement for capturing an image of the scene illuminated by the light source.

The imaging arrangement below also uses less clearance or headroom compared to other light sources having a single emitter array with a comparable number of emitters. This is because the wirebonds of emitter arrays can be formed in a more compact manner. As indicated above, the quantity of emitted light of the disclosed device compares favourably with other emitter arrays (with the same number of emitters) because any wirebond in the disclosed device traverses relatively few emitters. The imaging arrangement also reduces power consumption compared to an imaging arrangement that does not avail of a segmented light source. The imaging arrangement also improved thermal behaviour of the sparsely populated emitter arrays than comparable imaging arrangements.

The imaging arrangement can be used in any application that can benefit from using a wirebonded die in an adaptive light source, for example time-of-flight systems, robotic systems, drones, cell phones or security cameras In an embodiment, the emitter matrix includes at least 9 cells in a 3×3 array, for example with a total of five emitter cells (one emitter cell in the center of the array and one at each corner). In the semiconductor light-emitting device, the emitter cells of the emitter matrix may be smaller than the non-emitter cells, or vice versa; an emitter cell can be essentially square, or may be rectangular; and the pitch in the X-direction may be the same as the pitch in the Y-direction, or the pitch in the X-direction may be different from the pitch in the Y-direction. In the following, but without restriction in any way, it may be assumed that emitter cells and non-emitter cells are essentially the same size, i.e., an emitter cell and a non-emitter cell each occupy the same area of the semiconductor device, and the pitch in the X-direction is the same as the pitch in the Y-direction. A wirebond may have a diameter of about 30 µm, and the bond pad will be about three to five times larger. Since a cell is to provide at least enough room for a wirebond, the area of a cell may be in the order of 5,000 µm².

As indicated above, infrared semiconductor devices (e.g., IR-LEDs) may be used in various irradiance applications, for example in a depth map generator, a time-of-flight system, etc., and are generally wirebonded in order to improve current efficiency. Therefore, without restriction in any way, it may be assumed in the following that an emitter is an infrared light-emitting diode (IR-LED).

An emitter matrix can be formed to have any suitable distribution of emitter cells and interspersed non-emitter cells. For example, the emitter cells may be grouped in 2×2 arrangements, separated by "empty space", i.e., by non-emitter cells. An embodiment of the light source could have the other emitter matrix realised as the inverse in order to be able to completely illuminate a scene.

In an embodiment, an emitter matrix includes a simple alternating arrangement of emitter cells and non-emitter cells. For example, the cells can be arranged in a checkerboard pattern or a stripe pattern. In some cases, a checkerboard pattern includes an arrangement in which single emitter cells alternate with single non-emitter cells. Similarly, in some cases, a stripe pattern includes an arrangement in which single rows (or columns) of emitter cells alternate with single rows (or columns) of non-emitter cells.

One exemplary embodiment is given by a square array, i.e., an array or matrix in which the number of rows is the same as the number of columns. Two such square arrays can be prepared to complement each other. For example, two 3×3 checkerboard pattern arrays may be arranged side-by-side. A first 3×3 array includes five emitter cells, one in the center and one at each of the four corners. The complementary 3×3 array includes five non-emitter cells, one in the center and one at each of the four corners. In this embodiment, the light source includes a total of 9 emitters.

In a further exemplary embodiment, two 5×5 stripe-pattern arrays may be arranged side-by-side. A first 5×5 array includes three columns of emitter cells and two columns of non-emitter cells. The complementary 5×5 array in this case includes three columns of non-emitter cells and two columns of emitter cells. In this embodiment, the light source includes a total of 25 emitters.

In an embodiment, the emitter matrix may include an array of semiconductor emitters, of which only a subset will give rise to emitter cells. An "emitter cell" is effectively formed by connecting its semiconductor emitter as a diode into an electrical circuit, i.e., by connecting a wirebond between that cell and a bond pad. This step is used to connect the semiconductor emitter as part of an electric circuit. It follows that a non-emitter cell may actually include the structure of a semiconductor emitter. However, without any electrical connection to a bond pad, this structure may be unable to function as a semiconductor emitter. This straightforward approach permits existing masks and layer growth sequences to be applied during wafer manufacture, thereby avoiding the costs of providing dedicated masks, which may outweigh preparing regions that will not be used.

A non-emitter cell can accommodate a switching element such as a transistor. In one approach, the switching elements (e.g., GaN/GaAs transistors) and the emitters can be formed at the same time by using appropriate masks and layer deposition sequences and/or epitaxial growth sequences.

In one embodiment, discrete switching elements and emitter dies are mounted onto a substrate or carrier, for example onto a PCB or interposer. Each emitter die is mounted onto an emitter cell of the emitter matrix and is wirebonded to a switching element in a neighbouring non-emitter cell. Additional circuit connections can be provided in the body of the PCB using a suitable multilayer approach.

The semiconductor light-emitting device also includes an interface for connection to a driver, which is realised to control the emitters individually, for example according to the momentary scene illumination at an instant in time. Each emitter can be switched separately, and the intensity of each emitter can be adjusted to the momentary scene illumination. There are various ways of managing a segmented irradiance unit, and the skilled person will be familiar with control of the corresponding driver, which are not discussed here in detail.

In one embodiment, the imaging arrangement includes beam-forming optics for shaping the light emitted by the pair of semiconductor light-emitting devices. A beam-forming optic can spread the light from an emitter array to cover the entire scene. The resulting illumination pattern may be a copy of the emitter array pattern, i.e., with scene regions illuminated by the emitter cells, interspersed with non-illuminated scene regions (on account of the empty cells). Alternatively, a beam-forming optic can shape the light from the emitter cells to illuminate half the scene (when two emitter arrays are used). Similarly, a beam-forming optic can shape the light from the emitter cells of a single emitter array to illuminate the entire scene.

As mentioned above, each semiconductor light-emitting device of the light source can effectively illuminate one half of the scene, for example one emitter matrix can illuminate the left-hand side of a scene, while the other emitter matrix can illuminate the right-hand side of the scene. However, other arrangements are possible. For example, each emitter matrix may be used to cast light over the entire field of view, whereby the illumination pattern has the same checkerboard characteristic as the emitter matrix. Therefore, in such an embodiment, the semiconductor light-emitting devices may be complementary to each other, i.e., the emitter matrix of the first semiconductor light-emitting device is the complement of the emitter matrix of the second semiconductor light-emitting device. For example, the emitter matrix of the first semiconductor light-emitting device may be able to illuminate the upper left-hand corner of the scene and the lower right-hand corner of the scene, and not be able to illuminate the upper right-hand corner of the scene and the lower left-hand corner of the scene. The emitter matrix of the complementary second semiconductor light-emitting device is then able to illuminate the upper right-hand corner and the lower left-hand corner of the scene, but is not able to illuminate the upper left-hand corner and the lower right-hand corner of the scene. The same applies to all other "cells" in the illumination patterns that are cast onto the scene.

The imaging arrangement may be dimensioned for use in a compact mobile application such as in a compact camera or in a smartphone or also in any other space-constrained and/or battery-powered application such as a robot, a drone, an automobile dashboard, etc.

FIG. 1 shows an embodiment of a semiconductor light-emitting device 1. In this exemplary embodiment, the emitter matrix 10 comprises a 5×5 square array with emitter cells 10E alternating with non-emitter cells 10e. Each emitter cell 10E accommodates an IR-LED 10L. Each non-emitter cell 10e is "empty" in the sense that it does not accommodate a circuit component. In this exemplary embodiment, the emitter matrix 10 is suitable carrier such as a printed circuit board (PCB) prepared with copper tracks, an interposer, etc. To populate the emitter matrix, emitter dies 10L are mounted onto the carrier. An emitter such as an IR-LED can have one contact (e.g., the anode contact) at its underside, and another contact (e.g., the cathode contact) on top. The underside contact can be electrically connected to a circuit by a solder bond, while the topside contact can be electrically connected to the circuit by a wirebond. Here, one contact of each emitter die 10L is wirebonded to a bond pad at the edge of the emitter matrix 10, and the other contact is solder-bonded to a copper track, for example by a via extending into a multilayer PCB. The diagram shows a number of bond pads 10B for connection to a power supply and wirebonds 10W extending from the bond pads to the IR-LEDs 10L mounted on the emitter cells 10E. In this exemplary embodiment, the emitter array 10 is realised as an alternating pattern of emitter cells 10E and empty cells 10e, i.e., each emitter cell 10E (and therefore each emitter 10L) is flanked along its sides by an empty cell 10e, and vice versa.

Figure 2:
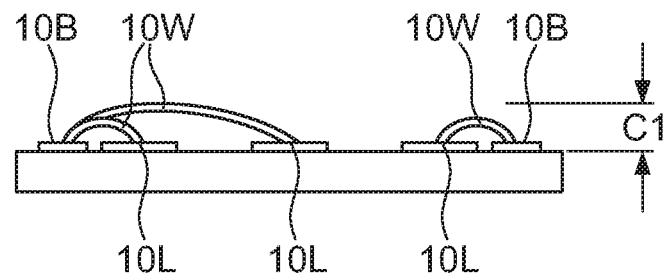
FIG. 2 shows a side view of the device of FIG. 1.
Figure 3:
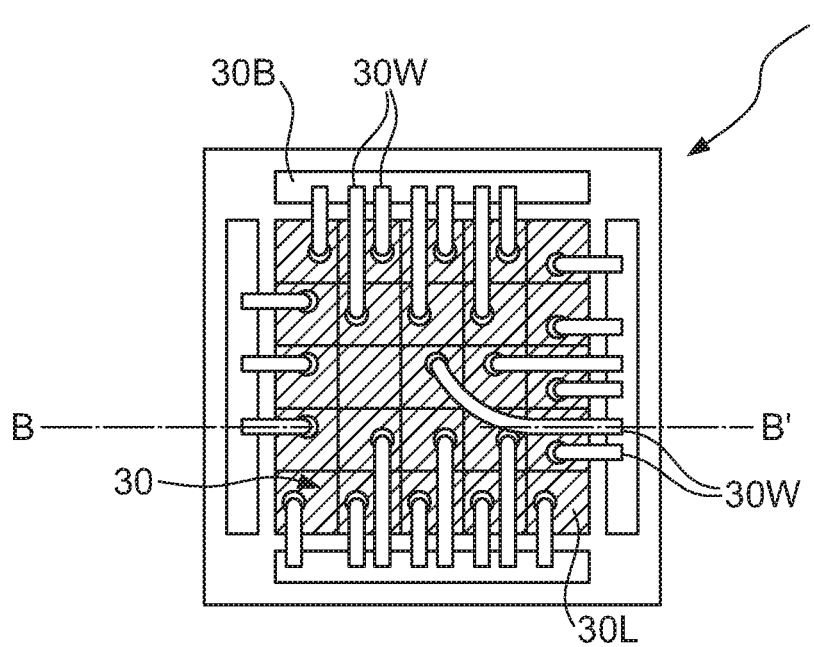
FIG. 3 shows an embodiment of another semiconductor light-emitting device.
Figure 4:
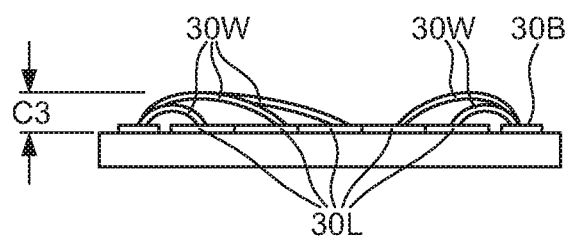
FIG. 4 shows a side view of the device of FIG. 3.

In this 5×5 array, the center cell is an empty cell 10e. The longest wirebonds therefore may avoid extending to the center cell. As shown in FIG. 2, which gives a cross-section A-A' through the device 1 of FIG. 1, the headroom or clearance C1 is therefore favourably small. With a favourably short connection and a wirebond that is arranged close to the surface, a clearance as low as 30 μm can be achieved. This is about 20% less than the headroom used by an equivalent emitter array. The overall headroom of the device 1 are lower than a comparable 5×5 array in which all cells are realised as emitter cells 10E. This is illustrated in FIG. 3 and FIG. 4, which show such another semiconductor light-emitting device 2 in plan view (FIG. 3) and in cross-section B-B' (FIG. 4). The reduction in headroom can be a significant, since headroom is a factor in many compact applications.

The emitter array 3 of FIG. 3 has wirebonds to all emitters 30L. Because of the small cell size, some wirebonds arc over other wirebonds, and a relatively long wirebond is used to reach the center cell. As shown in FIG. 4, which gives a side view of the device 3 of FIG. 3, the headroom or clearance C3 is therefore quite large, so that the overall space of the device 3 is greater than the device 1 of FIG. 1. In addition, the amount of light that is blocked by the wirebonds, which cross a greater number of emitters compared to the device 1, is larger in device 3. It is likely that device 3, when used to illuminate a scene, projects many wirebond shadows onto the scene.

Figure 5:
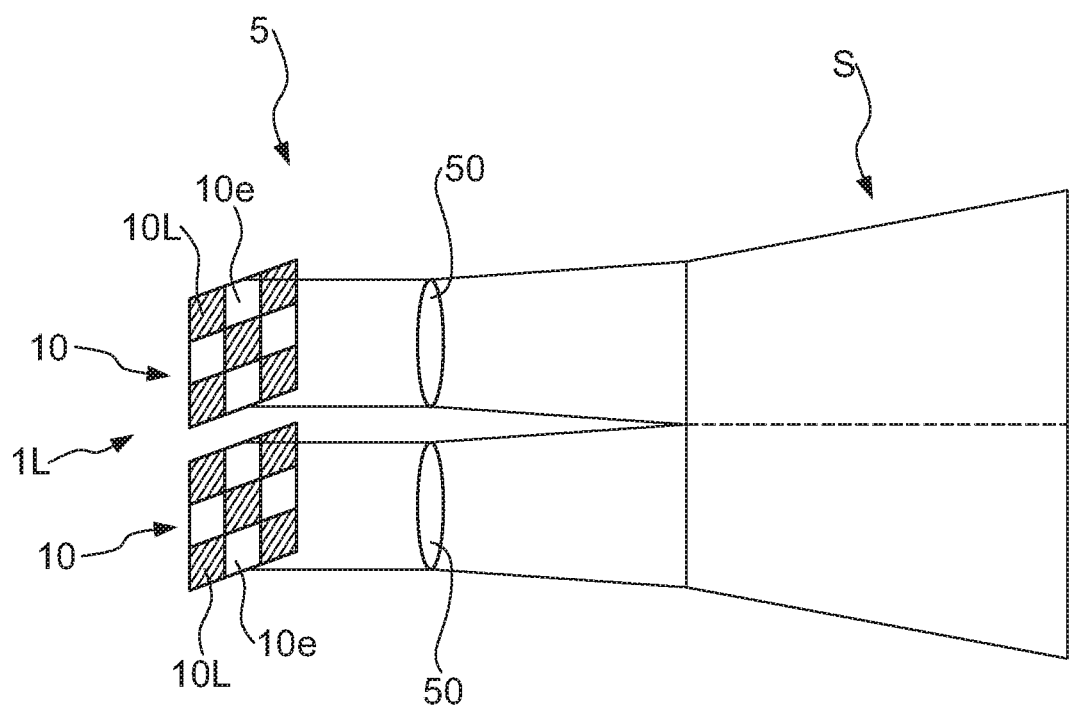
FIG. 5 shows an embodiment of an imaging arrangement.

A single such emitter array 1 could be used as a light source or irradiance unit to illuminate a complete scene (so that an image can be captured by an imaging sensor). However, the light source may be split into two smaller devices to allow each smaller irradiance unit to illuminate half a scene. FIG. 5 shows such an embodiment of the imaging arrangement 5. Here, a light source 1L comprises two semiconductor light-emitting devices that are arranged side-by-side. The emitter array 10 of each semiconductor light-emitting device is used to illuminate half of a scene S. In this exemplary embodiment, each emitter array 10 is a 3×3 array with an alternating arrangement of emitters 10L and empty cells 10e as described in FIG. 1 above. So that each emitter array 10 can "cover" its complete scene half, a beam shaping optic 50 is arranged in the light path of each emitter array 10. Here, the beam shaping optic 50 forms the individual light beams from the alternating emitters 10L so that the resulting beam can completely illuminate the scene half when all five emitters are active.

Figure 6:
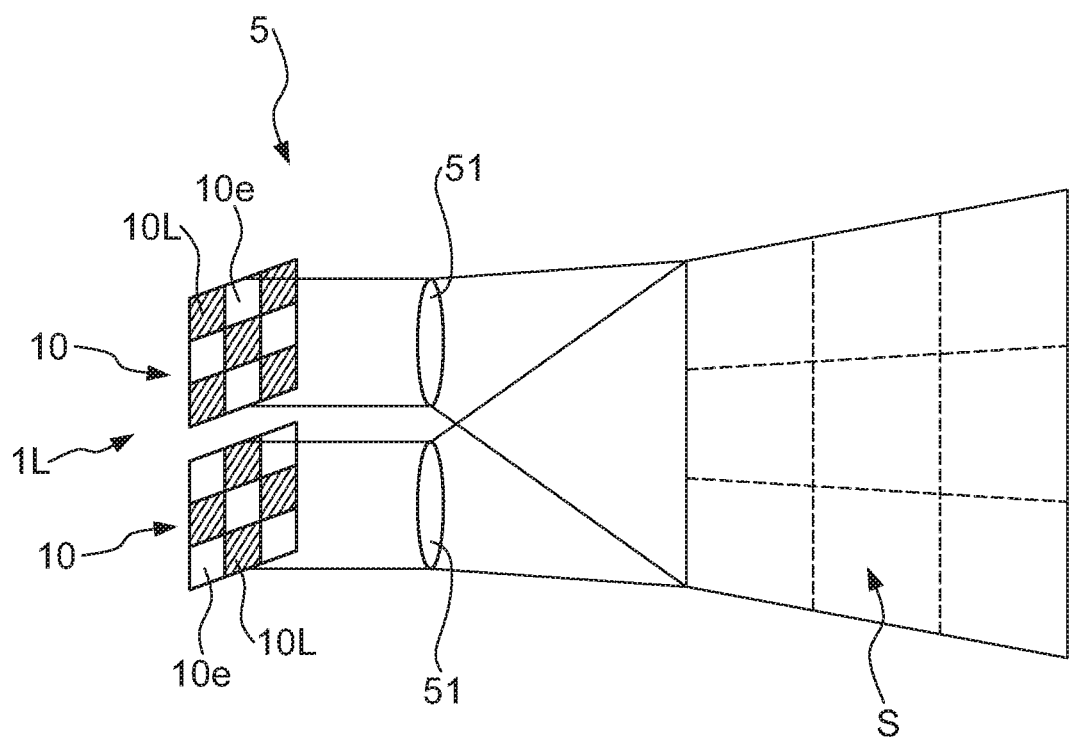
FIG. 6 shows another embodiment of an imaging arrangement.

FIG. 6 shows a further embodiment of the imaging arrangement 5. Again, the light source 1L comprises two semiconductor light-emitting devices arranged side-by-side, and the emitter array 10 of a semiconductor light-emitting device is used to illuminate half of a scene S. Here also, each emitter array 10 is a 3×3 array with an alternating arrangement of emitters 10L and empty cells 10e as described in FIG. 1 above. In this embodiment, each emitter array 10 can "cover" the entire scene S, casting an alternating pattern of illuminated regions (illuminated by its emitters 10L) and non-illuminated regions (on account of its empty cells 10e). In this exemplary embodiment, the emitter arrays 10 are complements of each other, so that a scene region that is not illuminated by one emitter array is illuminated by an emitter 10L of the other emitter array 10. Here also, a suitable beam shaping optic 51 is arranged in the light path of each emitter array 10 to form the individual light beams from the alternating emitters 10L into a beam that spreads to cover the entire scene S.

Figure 7:
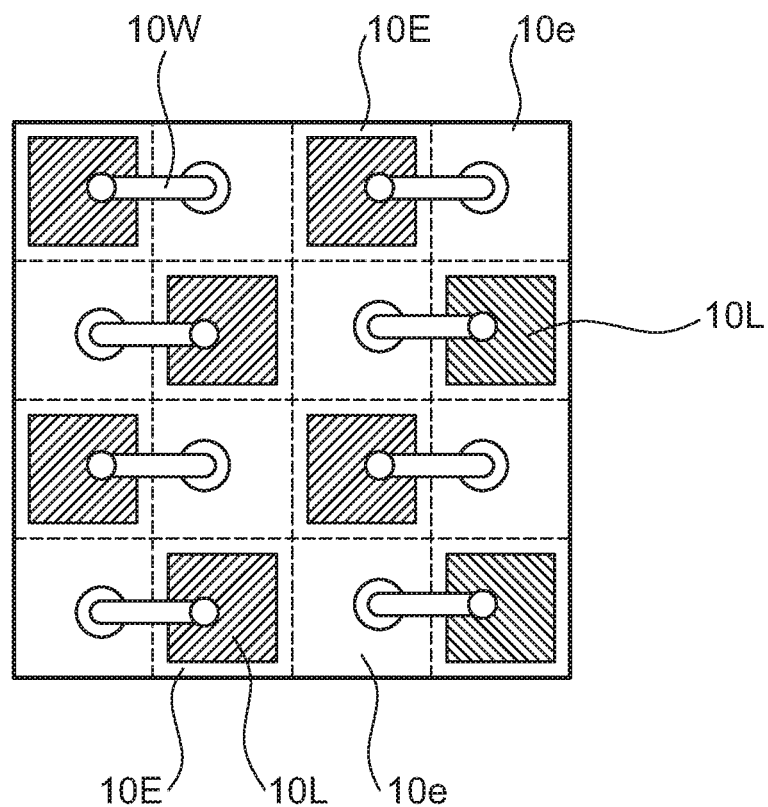
FIG. 7 shows a further embodiment of a semiconductor light-emitting device.

FIG. 7 illustrates a further embodiment of the semiconductor light-emitting device, and shows an emitter array 10 in which each emitter is realised as a discrete IR-LED 10L, and in which each non-emitter cell 10e is used to connect a neighbouring IR-LED 10L into an electrical circuit. To this end, the carrier is a multilayer PCB, and each non-emitter cell has a via extending into a connection layer in the interior of the PCB. In this way, each emitter 10L can be connected to a driver using a very short wirebond 10W that may be limited to only reach to the adjacent empty cell 10e.

Figure 8:
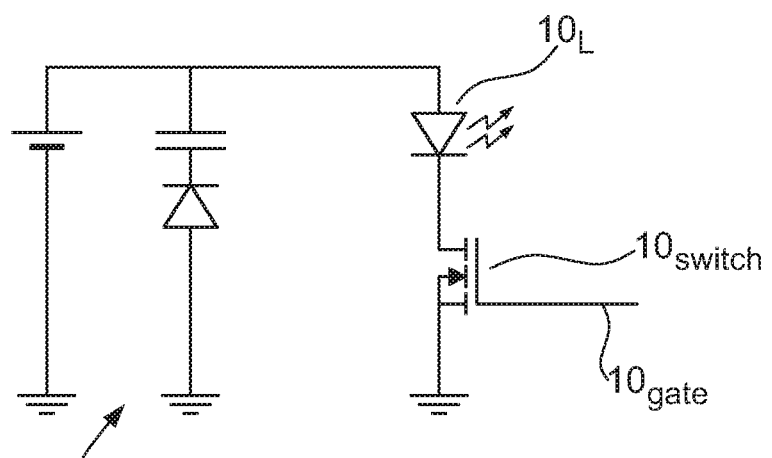
FIG. 8 shows simplified circuit diagram of an emitter circuit.
Figure 9:
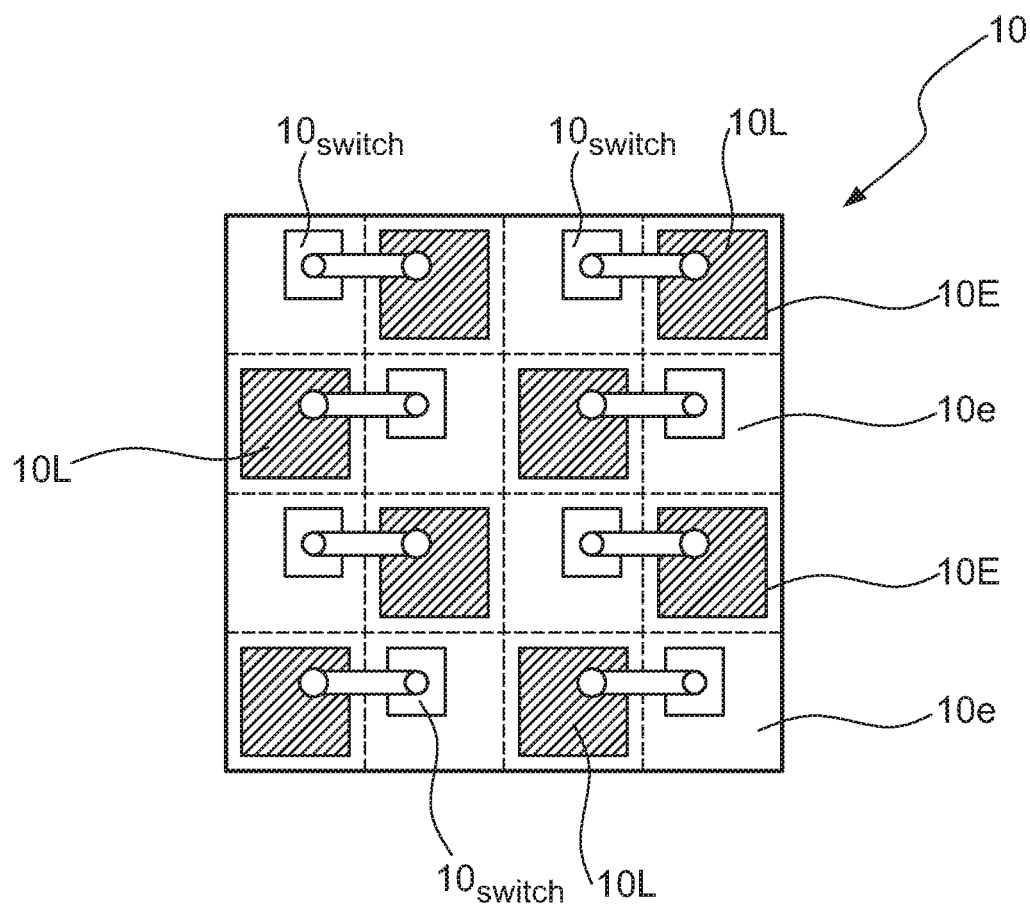
FIG. 9 shows a further embodiment of the semiconductor light-emitting device implementing the circuit of FIG. 8.

In a further embodiment, the empty cells 10e can be used to accommodate a switching element, and each emitter can be electrically connected to a neighbouring switching element. A simplified circuit diagram of one such emitter/switch pair is shown in FIG. 8, which shows an emitter 10L with its anode connected to a driver 80 and its cathode connected to the drain of a switching element 10 switch. In this exemplary embodiment, the switching element $10_{switch}$ is an enhancement-mode MOSFET. An embodiment using several such emitter/switch pairs is shown in FIG. 9, mounted on a multilayer PCB carrier. Here, the entire circuit comprises multiple such emitter/switch pairs connected in parallel. The anode of each emitter 10L is connected to a power supply of the driver 80 using conductive tracks embedded in the PCB carrier and a solder bond to the contact on the underside of the emitter 10L. The cathode of each emitter 10L is connected to the appropriate contact of the switching element $10_{switch}$ (located in an adjacent non-emitter cell 10e) by a wirebond 10W. Of course, if the emitter 10L is realised as a flip-chip die, its cathode could be connected to the adjacent switching element $10_{switch}$ by a conductive track of the PCB. The other terminals of the switching element $10_{switch}$ are connected to the circuit by vias to conductive tracks embedded in the PCB carrier. By reducing the current loop to the maximum by having a switching element $10_{switch}$ and ground in close proximity to an emitter 10L, the parasitic line impedance is reduced accordingly. This may be particularly desirable for an emitter array 10 with a high switching frequency (e.g., 10 MHz or more).

REFERENCE SIGNS semiconductor light-emitting device 1
light source 1L
emitter matrix 10
emitter cell 10E
emitter 10L
non-emitter cell 10e
bond pads 10B
wirebond 10W
switching element $10_{switch}$
MOSFET gate control $10_{gate}$
clearance C1
light source 1L
beam-forming optics 50, 51
scene S
prior art device 3
emitter matrix 30
emitter cells 30L
bond pads 30B
wirebond 30W
clearance C3
power supply 80

Although the above has been disclosed in the form of various embodiments and variations thereon, it will be understood that numerous additional modifications and variations could be made thereto without departing from the scope of the disclosure. For example, although the focus in the above has been on a matrix of infrared emitters, it shall be understood that other emitters may be used. The emitters of the emitter matrix may be vertical cavity surface emitting lasers (VCSELs), for example, since such emitters may also benefit from close packing, the possibility of arranging an electronic component in close proximity to a VCSEL, the improved thermal performance, etc. Ribbon bonds may be used instead of or in addition to wirebonds.

The features and example embodiments described above may equally pertain to the different aspects. In particular, with the disclosure of features relating to a lighting device according to the first aspect, also corresponding features relating to a method for production according to the second aspect and to the use according to the third aspect are disclosed.

The dependent claims and the description provide embodiments and features of the embodiments. Features of the embodiments may be combined as appropriate. Features described in the context of one claim category can apply equally to another claim category.

Other features will become apparent from the following detailed description considered in conjunction with the accompanying drawings. It is to be understood, however, that the drawings are designed solely for purposes of illustration and not as a definition of the limits of the embodiments.

The invention claimed is:

1. A semiconductor light-emitting device configured to illuminate a scene, and comprising:
   an emitter matrix comprising an arrangement of emitter cells interspersed with non-emitter cells in a regular matrix array formation in which an emitter cell and a non-emitter cell each have essentially a same area, each emitter cell comprising a semiconductor emitter, and each non-emitter cell being a cell that does not contain any semiconductor emitter, each semiconductor emitter comprising circuitry that, when driven, is configured to emit light, at least one non-emitter cell comprising a switching element;
   bond pads for connection to a driver configured to drive at least one of the semiconductor emitters; and
   wirebonds each extending from one of the bond pads to provide current of the driver to the semiconductor emitter of one of the emitter cells.

2. The semiconductor light-emitting device of claim 1, wherein the emitter matrix comprises an alternating arrangement of emitter cells and non-emitter cells.

3. The semiconductor light-emitting device of claim 1, wherein the emitter cells and non-emitter cells are arranged in a checkerboard pattern.

4. The semiconductor light-emitting device of claim 1, wherein the emitter cells and non-emitter cells are arranged in stripe pattern.

5. The semiconductor light-emitting device of claim 1, wherein the emitter matrix comprises an array of at least nine emitter cells.

6. The semiconductor light-emitting device of claim 1, wherein the emitters of the emitter matrix are infrared light-emitting diodes.

7. The semiconductor light-emitting device of claim 1, wherein the emitters of the emitter matrix are vertical cavity surface-emitting lasers.

8. The semiconductor light-emitting device of claim 1, wherein no wirebond extends from any of the bonding pads to any of the non-emitter cells.

9. The semiconductor light-emitting device of claim 1, wherein:
   a number of wirebonds is fewer than a number of cells in the emitter matrix, and
   a center cell of the emitter matrix is one of the non-emitter cells.

10. The semiconductor light-emitting device of claim 1, wherein:
   each wirebond extends to a different switching element, and
   each switching element is coupled with the semiconductor emitter of an adjacent emitter cell.

11. An imaging arrangement comprising:
   a light source for illuminating a scene, the light source comprising a pair of semiconductor light-emitting devices, each semiconductor light-emitting device comprising:
      an emitter matrix comprising an arrangement of emitter cells interspersed with non-emitter cells in a regular matrix array formation in which an emitter cell and a non-emitter cell each having essentially a same area, each emitter cell comprising a semiconductor emitter, and each non-emitter cell being a cell that does not contain any semiconductor emitter, each semiconductor emitter comprising circuitry that, when driven, is configured to emit light;
      bond pads for connection to a driver configured to drive at least one of the semiconductor emitters; and
      wirebonds each extending from one of the bond pads to provide current of the driver to the semiconductor emitter of one of the emitter cells,
      the emitter matrix of a first of the semiconductor light-emitting devices arranged to illuminate essentially one half of the scene and the emitter matrix of a second of the semiconductor light-emitting devices arranged to illuminate essentially another half of the scene; and
   an image sensor arrangement for capturing an image of the scene illuminated by the light source.

12. The imaging arrangement of claim 11, further comprising beam-forming optics for shaping light emitted by the emitter matrices of the semiconductor light-emitting devices.

13. The imaging arrangement of claim 11, wherein the emitter matrix of one of the semiconductor light-emitting devices generates a first illumination pattern, and the emitter matrix of another of the semiconductor light-emitting devices generates a second illumination pattern, the second illumination pattern being an inverse of the first illumination pattern.

14. The imaging arrangement of claim 11, wherein the imaging arrangement is disposed in a compact mobile device.

15. The imaging arrangement of claim 11, wherein the emitter matrix of at least one of the first or second of the semiconductor light-emitting devices comprises an alternating arrangement of the emitter cells and non-emitter cells.

16. The imaging arrangement of claim 11, wherein the emitter cells and non-emitter cells of at least one of the first or second of the semiconductor light-emitting devices are arranged in a checkerboard pattern.

17. The imaging arrangement of claim 11, wherein the emitter cells and non-emitter cells of at least one of the first or second of the semiconductor light-emitting devices are arranged in stripe pattern.

18. The imaging arrangement of claim 11, wherein at least one non-emitter cell of at least one of the first or second of the semiconductor light-emitting devices comprises a switching element.

19. The imaging arrangement of claim 11, wherein the emitter matrix of at least one of the first or second of the semiconductor light-emitting devices comprises an array of at least nine emitter cells.

* * * * *